United States Patent

Mahler et al.

[11] Patent Number: 5,097,794
[45] Date of Patent: Mar. 24, 1992

[54] APPARATUS FOR TRANSPORTING SUBSTRATES IN A VACUUM COATING SYSTEM

[75] Inventors: Peter Mahler, Hainburg; Klaus Michael, Gelnhausen; Rainer Gegenwart, Roedermark; Michael Scherer, Rodenbach, all of Fed. Rep. of Germany

[73] Assignee: Leybold Aktiengesellschaft, Hanau, Fed. Rep. of Germany

[21] Appl. No.: 616,342

[22] Filed: Nov. 21, 1990

[30] Foreign Application Priority Data

Sep. 21, 1990 [DE] Fed. Rep. of Germany ....... 4029905

[51] Int. Cl.⁵ .............................................. C23C 16/00
[52] U.S. Cl. .................................. 118/719; 118/725; 118/729; 204/298.25; 204/298.26
[58] Field of Search ............ 118/719, 725, 729; 204/298.25, 298.26

[56] References Cited

U.S. PATENT DOCUMENTS

| | | | |
|---|---|---|---|
| 4,042,128 | 8/1977 | Shrader | 414/287 |
| 4,311,427 | 1/1982 | Coad | 414/217 |
| 4,544,468 | 10/1985 | Munz | 204/192.15 |
| 4,765,273 | 8/1988 | Anderle | 118/729 |
| 4,926,789 | 5/1990 | Wenger | 118/668 |

FOREIGN PATENT DOCUMENTS 0346815 12/1989 European Pat. Off. .
2-163377 6/1990 Japan .

Primary Examiner—Richard Bueker
Attorney, Agent, or Firm—Felfe & Lynch

[57] ABSTRACT

In a device for transporting substrates in vacuum coating systems with several stations, comprising several substrate holders 16 of plate-like configurations which can e moved across the stations along a prescribed path of transportation in a vertical position and which interact with rails 13, 14 being provided in the area of their foot part 15 below the substrates 22, 23 to be mounted to the substrate holders 16, the foot part 15 of the substrate holder 16 has a pair of rails 13, 14 spaced parallel apart and disposed in a vertical plane. The smaller sides thereof, which face one another, have longitudinal grooves 13a, 14 which correspond with rollers 7, 8 or sliding pads being disposed stationary on the bottom part of the device and being provided in rows corresponding to the course of the grooves and in planes that are on top of each other and spaced vertically apart. The substrate holder 16 has a shaft-like recess 24 which extends from the top downward into the area of the foot part 15 parallel to the rails and into which, while passing the station, extends a flat heating device 11 extending vertically toward the bottom and disposed above the substrate holder 16 at the top wall part 4a. The substrate holder 16 surrounds the heating device 11 in a U-shaped manner.

4 Claims, 1 Drawing Sheet

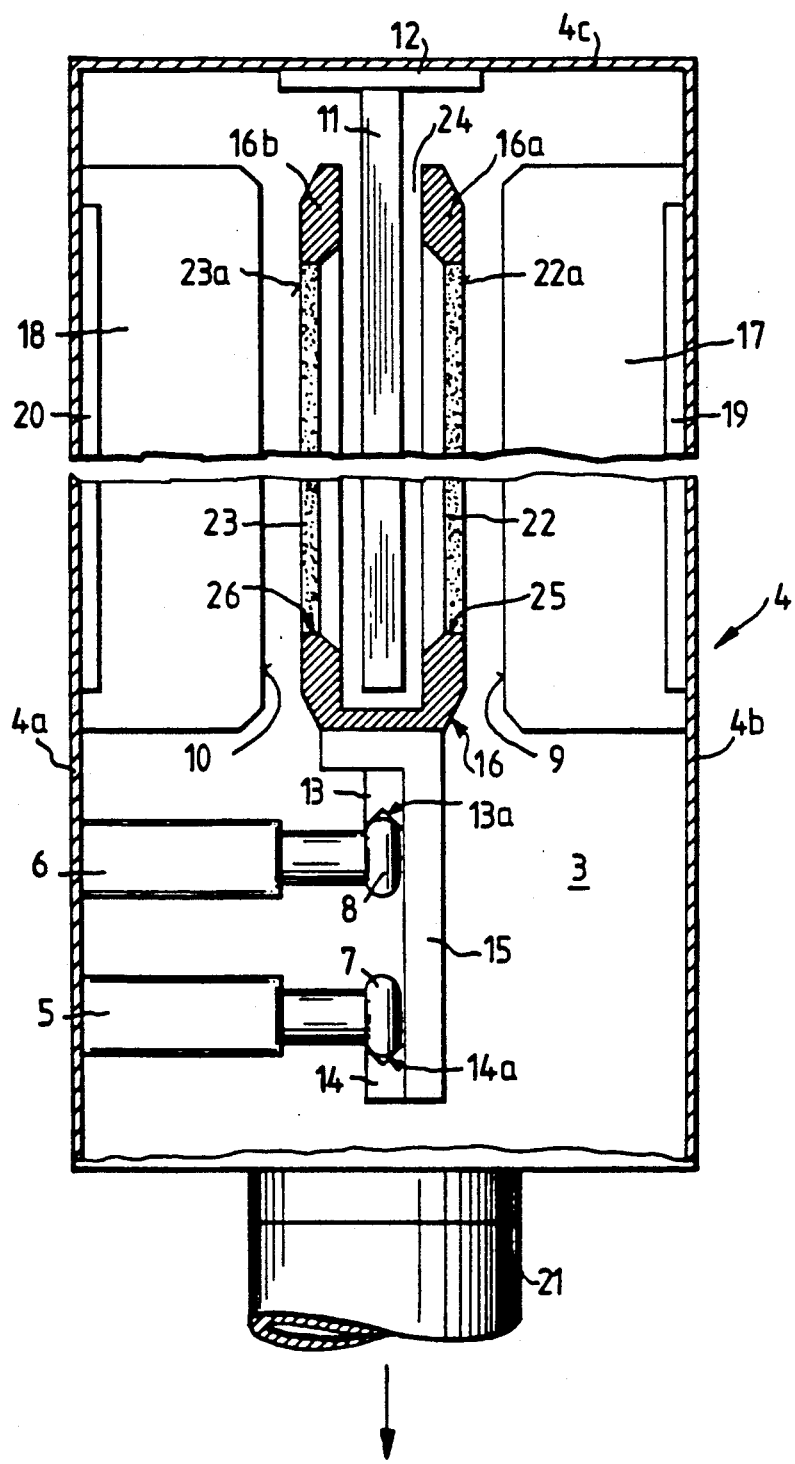

APPARATUS FOR TRANSPORTING SUBSTRATES IN A VACUUM COATING SYSTEM

BACKGROUND OF THE INVENTION

The invention relates to a device for transporting substrates in vacuum coating systems with several stations, substrate holders of an approximately plate-like, flat, parallelpiped configuration which are moved across the stations in a vertical position following a prescribed path of transportation. Pairs of rolling bodies, sliding pads or rollers hold and guide the substrate holders while interacting with guide rails disposed underneath the substrates mounted to the substrate holders.

These substrate holders are either plates with recesses corresponding to the substrates, or frames with cross bars to which the substrates are attached. Generally, the substrate holder serves to hold a plurality of substrates.

A transporting device of the aforesaid kind is known from U.S. Pat. No. 4,042,128 wherein the plate-like substrate holders, with their main plane being in a vertical position, are guided at their upper and lower longitudinal edges between rollers. The rollers can be rotated around vertical axes. At their lower edges the substrate holders rest in addition on support rollers with a horizontal axis of rotation. The lower guiding rollers alone, however, are not able to keep the substrate holders in an exact vertical position and transport them; a stable positioning is only possible with the help of the above guide rollers.

Also known is a transporting device for vacuum coating systems (EP 0 254 145 B1) to which U.S. Pat. No. 4,765,273, corresponds with several stations and a roller system for the guiding and the advance of essentially two-dimensional substrate holders in a vertical position along a prescribed path of transportation across the stations. Pairs of guide rollers are mounted in the area of the lower edge of the substrate holders. These pairs of rollers accommodate the substrate holder between them and rotate about vertical axes. The substrate holders are guided by the roller systems only in the area of their lower edges. The guide rollers have running surfaces which are provided on the lower and upper end of at least one guide roller of one pair of rollers, respectively. The other respective guide roller of the same pair of rollers has at least one moving surface and at least three moving surfaces of one pair of rollers form a stable clamping connection with respect to the substrate holder.

This known transportation device was based on the task of eliminating as far as possible any layer material which is trickling down and could interfere with the coating process.

Further, it is known (DE 31 07 914) to which U.S. Pat. No. 4,544,468 corresponds to thermally pretreat the substrates with a heating device in a separate lock chamber. Finally, it has been proposed to furnish the substrate holder in a transporting device for a vacuum coating system with a foot part which is guided on stationary rails (EP 0 346 815).

SUMMARY OF THE INVENTION

It is therefore a particular object of the present invention to provide a substrate holder for several substrates and to configure this holder such that the substrates can be heated simultaneously by the same heating source and with the same intensity. Moreover, during transport, the substrate holders should be held and guided absolutely free of interference and with a minimum of lateral movement (shaking).

This object is accomplished in that the substrate holder has a foot part which is provided with a pair of parallel, spaced-apart rails running in a vertical plane. The smaller sides thereof are provided with longitudinal grooves which face one another and cooperate with rollers or sliding pads. The latter are fixed at the bottom of the device and are disposed in rows corresponding to the direction of the groove and spaced apart in vertical planes that are located on top of one another. From the top downward and extending to the area of the foot part, the substrate holder has a narrow channel running parallel to the rails. When passing through the stations, a flat heating device extends vertically toward the bottom of this channel from above the substrate holder.

Preferably, the substrate holder has two frame-like sides disposed in parallel planes which form the channel therebetween. The substrates are inserted in window-like openings in these sides. These side parts are configured as one piece or are mounted to a floor part of the channel by means of rivets, screws or via joints.

BRIEF DESCRIPTION OF THE DRAWING

The invention allows the most various embodiments, one of which is diagrammatically represented in the attached drawing showing a cross section of the device.

As seen in the drawing, the device comprises rollers 7, 8 rotatably mounted to arms 5, 6 extending horizontally from the side wall 4a of housing 4 of coating chamber 3. Further, it comprises the two cathodes 9, 10 firmly attached to the two side walls 4a, 4b, the plate-like heating element 11 held at the upper wall 4c, and/or the insulator 12. Foot part 15 is provided with rails 13, 14 of the substrate holder 16, which has a U-like cross section, the two frame-like side parts 16a, 16b holding the substrates 22, 23. The two cathodes 19, 20 are firmly attached to the side walls 4a, 4b including the cathode diaphragms 17, 18. The suction piece 21 leads to a not represented turbo molecular pump.

During operation of the diagrammatically represented coating station, the substrates are moved in a direction that is perpendicular to the sectional plane until they reach a position opposite the cathodes 19, 20 as seen in the drawing.

After the coating of the external surfaces 22a, 23a of the substrates 22, 23, the latter are further transported in the same direction (perpendicular to the plane of drawing) until they reach the next processing station. The discoidal substrates 22, 23 are held by the side parts 16a, 16b of the substrate holders 16. These side parts cradle the substrates in a frame-like manner. The substrate holder in turn is rigidly connected to the foot part 15 or, together therewith, configured as one piece. The foot part 15 is attached to a pair of rails 13, 14 in a threaded or welded connection which in turn have longitudinal grooves 13a, 14a with rollers 7 and 8 running therein. The latter are supported on arms 5 and 6 where they are successively spaced apart in two rows and rotatably mounted. The distance at which the rows of rollers 5 and 6 are spaced apart from one another is selected such that the foot part 15 is supported and guided thereon in a stable manner.

In order to ensure that the substrates 22, 23 have the temperature necessary for the coating process, provision is made for a plate-like heating element 11 which is attached to the upper part 4c of the housing 4 at insulator 12. This heating element 11 extends into the shaft-like groove 24 and is dimensioned such that the substrates 22, 23 are heated up uniformly from their rear side. In order to keep the radiation loss as small as possible, and the temperature of both substrates 22, 23 on the same level, the distance remaining between heating the elements and the substrates 22, 23 are identical and as small as possible.

We claim:

1. Apparatus for transporting substrates along a path through a vacuum coating system with several coating stations, each said substrate having a first face which is coated and an opposed face, said apparatus comprising
   a housing having a top;
   a substantially planar heating device running parallel to said path, said heating device being fixed to said top of said housing and extending vertically toward said bottom;
   first sliding means extending through said housing parallel to said path past said coating stations,
   second sliding means extending through said housing parallel to said path past said coating stations, said second sliding means being spaced vertically below said first sliding means,
   a substrate holder comprising a foot part which carries a pair of parallel rails having respective mutually facing grooves which are vertically spaced to engage respective first and second sliding means, and a narrow channel above said sliding means, said heating device extending into said channel, said channel running parallel to said path.

2. Apparatus as in claim 1 wherein said substrate holder comprises a pair of parallel plate-like members attached to said foot part and defining said narrow channel therebetween, each plate-like member having a window-like opening for carrying a substrate therein, whereby,
   upon placing said substrate in said openings with said first faces facing oppositely and upon transporting said substrates along said path, said first faces can be coated at said stations while said opposed faces are heated by said heating device.

3. Apparatus as in claim 1 wherein first sliding means comprises a first row of rollers and said second sliding means comprises a second row of rollers.

4. Apparatus as in claim 3 wherein said housing comprises sidewalls adjacent said path, said apparatus further comprising arms extending horizontally from at least one of said sidewalls, said rollers being mounted for rotation on said arms.

* * * * *

UNITED STATES PATENT AND TRADEMARK OFFICE
CERTIFICATE OF CORRECTION

PATENT NO. : 5,097,794
DATED : March 24, 1992
INVENTOR(S) : Peter Mahler et al.

It is certified that error appears in the above-identified patent and that said Letters Patent is hereby corrected as shown below:

Column 3, lines 2-3, delete "shaft-like" and insert
    -- channel --.

Abstract, delete "Abstract" and replace with new Abstract
    per Amendment of January 22, 1991.

Signed and Sealed this

Fifth Day of October, 1993

Attest:

BRUCE LEHMAN

Attesting Officer

Commissioner of Patents and Trademarks